(12) United States Patent
Chiang et al.

(10) Patent No.: US 9,536,810 B1
(45) Date of Patent: Jan. 3, 2017

(54) FLAT PAD STRUCTURE FOR INTEGRATING COMPLEMENTARY METAL-OXIDE-SEMICONDUCTOR (CMOS) IMAGE SENSOR PROCESSES

(71) Applicant: Taiwan Semiconductor Manufacturing Co., Ltd., Hsin-Chu (TW)

(72) Inventors: Yen-Ting Chiang, Tainan (TW); Ching-Chun Wang, Tainan (TW); Dun-Nian Yaung, Taipei (TW); Feng-Chi Hung, Hsin-Chu County (TW); Hsiao-Hui Tseng, Tainan (TW); Ming-Tsong Wang, Taipei (TW); Shyh-Fann Ting, Tainan (TW); Wei Chuang Wu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/737,979

(22) Filed: Jun. 12, 2015

(51) Int. Cl.
| | |
|---|---|
| *H01L 23/482* | (2006.01) |
| *H01L 27/146* | (2006.01) |
| *H01L 23/485* | (2006.01) |
| *H01L 23/48* | (2006.01) |
| *H01L 23/528* | (2006.01) |
| *H01L 31/05* | (2014.01) |
| *H01L 31/0224* | (2006.01) |

(52) U.S. Cl.
CPC .......... *H01L 23/4824* (2013.01); *H01L 23/48* (2013.01); *H01L 23/481* (2013.01); *H01L 23/485* (2013.01); *H01L 23/5283* (2013.01); *H01L 27/14621* (2013.01); *H01L 27/14636* (2013.01); *H01L 27/14643* (2013.01); *H01L 27/14685* (2013.01); *H01L 31/0224* (2013.01); *H01L 31/05* (2013.01); *H01L 31/0508* (2013.01)

(58) Field of Classification Search
CPC .... H01L 23/48; H01L 23/481; H01L 23/4824; H01L 23/485; H01L 23/528; H01L 23/5283; H01L 23/544; H01L 31/02002; H01L 31/0224; H01L 31/05; H01L 31/0508; H01L 23/482
See application file for complete search history.

(56) References Cited

U.S. PATENT DOCUMENTS

| | | | |
|---|---|---|---|
| 8,466,010 B2 | 6/2013 | Tai et al. | |
| 2003/0181029 A1* | 9/2003 | Nin | H01L 22/34 438/612 |

(Continued)

*Primary Examiner* — Eduardo A Rodela
(74) *Attorney, Agent, or Firm* — Eschweiler & Associates, LLC

(57) ABSTRACT

A pad structure for a complementary metal-oxide-semiconductor (CMOS) image sensor is provided. A semiconductor substrate is arranged over a back end of line (BEOL) metallization stack, and comprises a scribe line opening. A buffer layer lines the scribe line opening. A conductive pad comprises a base region and a protruding region. The base region is arranged over the buffer layer in the scribe line opening, and the protruding region protrudes from the base region into the BEOL metallization stack. A dielectric layer fills the scribe line opening over the conductive pad, and is substantially flush with an upper surface of the semiconductor substrate. Further, a method for manufacturing the pad structure, as well as the CMOS image sensor, are provided.

20 Claims, 11 Drawing Sheets

(56) References Cited

U.S. PATENT DOCUMENTS

| | | | |
|---|---|---|---|
| 2004/0110365 A1 | 6/2004 | Su et al. | |
| 2011/0102657 A1* | 5/2011 | Takahashi | H01L 23/481 348/308 |
| 2011/0127631 A1* | 6/2011 | Kawashima | H01L 27/14603 257/466 |
| 2011/0278735 A1* | 11/2011 | Yen | B81B 7/007 257/774 |
| 2013/0328147 A1* | 12/2013 | Ho | H01L 31/02002 257/432 |
| 2014/0151840 A1* | 6/2014 | Cheng | H01L 27/14636 257/460 |
| 2015/0333093 A1* | 11/2015 | Ting | H01L 27/14623 257/432 |

\* cited by examiner

US 9,536,810 B1

FLAT PAD STRUCTURE FOR INTEGRATING COMPLEMENTARY METAL-OXIDE-SEMICONDUCTOR (CMOS) IMAGE SENSOR PROCESSES

BACKGROUND

Many modern day electronic devices include optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) complementary metal-oxide-semiconductor (CMOS) image sensor. BSI CMOS image sensors advantageously have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
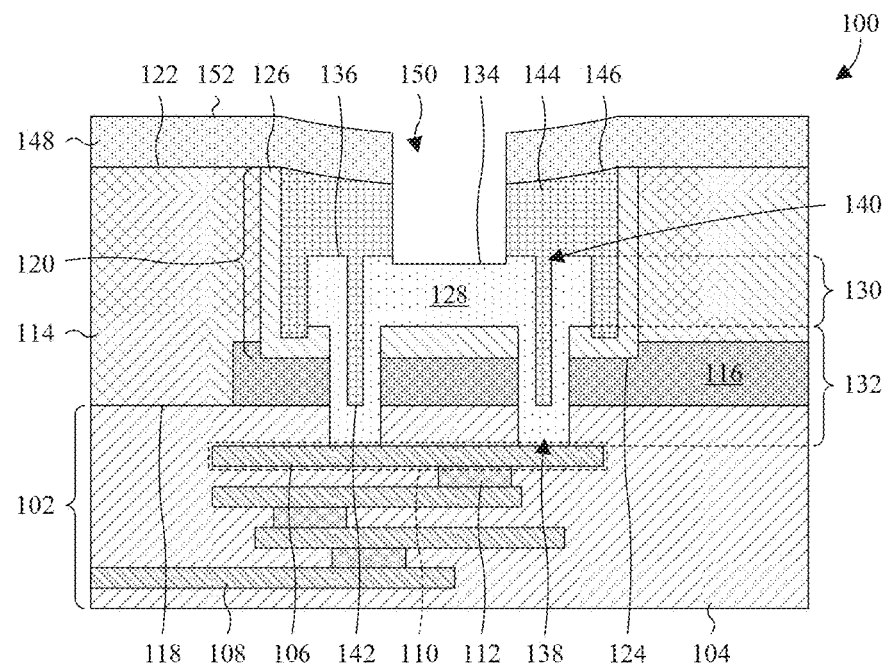
FIG. 1 illustrates a cross-sectional view of some embodiments of an integrated chip having a flat pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary metal-oxide-semiconductor (CMOS) image sensors include an array of pixels sensors arranged within a semiconductor substrate of an integrated circuit (IC). Further, some CMOS image sensors include an array of color filters arranged over the pixel sensor array, and buried within a light-receiving side of the IC. Burying the color filter array within the integrated circuit advantageously improves optical performance. For example, one or more of cross talk, quantum efficiency, and SNR-X (i.e., minimum luminance to achieve a signal-to-noise ratio (SNR) of X, such as 10) may be improved. While burying the color filter array provides improved optical performance, integrating the buried color filter array (BCFA) process with existing CMOS image sensor processes during manufacture poses challenges. For example, some methods for manufacturing the CMOS image sensors with the BCFA, form a passivation layer on the light-receiving side of the IC. Pads are then formed laterally surrounding the pixel sensor array, in a scribe line opening on the light-receiving side of the IC. With the pads formed, the BCFA is formed at a location buried in the passivation layer, according to the BCFA process.

A limitation of the BCFA process is that it is dependent upon the light-receiving side of the IC having a surface that is substantially planar (e.g., flat). Failure to have a substantially planar surface may negatively affect optical performance. However, the scribe line opening creates discontinuities on the surface of the light-receiving side. One approach for addressing this limitation is to fill the scribe line opening with a dielectric layer, and to perform a chemical mechanical polish (CMP), before performing the BCFA process. While the dielectric filling approach leads to a substantially planar surface on the light-receiving side of the IC, it may also damage the passivation layer (e.g., with the CMP). Such damage may negatively affect the optical performance gains from the BCFA.

In view of the foregoing, the present application is directed to a method for integrating a pad process with a BCFA process during the manufacture of an image sensor so as to eliminate passivation layer damage caused by the pad process. According to some embodiments of the method, a pad is formed within a scribe line opening on a light-receiving side of an IC. Further, a dielectric layer is formed within the scribe line. A planarization process is performed causing the dielectric layer to have an upper surface that is substantially planar and even with a neighboring surface of the IC. With the flat pad structure formed, a passivation layer is formed on the light-receiving surface of the IC and over the dielectric layer, and a BCFA or another structure is formed on the light-receiving surface. By forming the passivation layer after forming the flat pad structure, passivation layer damage due to the pad and dielectric layer formation is advantageously eliminated (e.g., since the passivation layer is not formed until after the pad and dielectric layer formation). Further, by eliminating the passivation layer damage, optical performance is advantageously improved and subsequent structures that are dependent upon the passivation layer may be formed without problem or performance degradation.

With reference to FIG. 1, a cross-sectional view 100 of some embodiments of an integrated chip having a flat pad structure is provided. The flat pad structure includes a BEOL metallization stack 102. The BEOL metallization stack 102 includes an interlayer dielectric (ILD) layer 104 and metallization layers 106, 108 stacked within the ILD layer 104. The ILD layer 104 may be, for example, a low κ dielectric (i.e., a dielectric with a dielectric constant less than about 3.9) or an oxide. The metallization layers 106, 108 include an upper metallization layer 106 with a metal line 110, and are electrically coupled to one another by vias 112 of the BEOL metallization stack 102. The metallization layers 106, 108, the vias 112, and the metal line 110 may be, for example, a metal, such as aluminum copper, aluminum, germanium, copper, or some other metal.

A semiconductor substrate 114 and an isolation region 116 are arranged over the BEOL metallization stack 102. The semiconductor substrate 114 and the isolation region 116 both abut an upper surface 118 of the BEOL metallization stack 102, and the isolation region 116 extends vertically therefrom into the semiconductor substrate 114. The semiconductor substrate 114 may be, for example, a bulk semiconductor substrate, such as a bulk silicon substrate, or a silicon-on-insulator (SOI) substrate. The isolation region 116 may be, for example, a shallow trench isolation (STI) region or an implant isolation region.

A scribe line opening 120 is arranged in the semiconductor substrate 114 and, in some embodiments, the isolation region 116. The scribe line opening 120 is defined vertically between an upper surface 122 of the semiconductor substrate 114 and a surface 124 that is recessed below the upper surface 122. The recessed surface 124 may be that of the semiconductor substrate 114 and/or that of the isolation region 116. Further, although not visible, the scribe line opening 120 typically extends laterally around a pixel sensor array, whereby it typically has footprint with a central void corresponding to the pixel sensor array.

A buffer layer 126 lines the scribe line opening 120, and is confined to the scribe line opening 120. Further, the buffer layer 126 supports a pad 128 within the scribe line opening 120. The buffer layer 126 includes a first region lining a recessed surface 124 of the scribe line opening 120 directly under the pad 128, a second region lining sidewall surfaces of the scribe line opening 120, and a third region lining the surface laterally between the first and second regions. In some embodiments, the first, second, and third regions have substantially uniform thicknesses. Further, in some embodiments, the first region may have a first region thickness greater than a second region thickness of the second region, and the second region thickness may be greater than a third region thickness of the third region. The buffer layer 126 may be, for example, a dielectric, such as silicon dioxide or some other oxide.

The pad 128 is conductive and may be, for example, a metal, such as aluminum copper. The pad 128 includes a base region 130 and a protruding region 132 underlying the base region 130. The base region 130 is confined to the scribe line opening 120, and has sidewall surfaces laterally spaced from neighboring sidewall surfaces of the buffer layer 126 and/or laterally spaced from neighboring sidewall surfaces of other pads (not shown). In some embodiments, the base region 130 has a substantially uniform thickness. Further, in other embodiments, the base region 130 may have a surface 134 that is recessed below an upper surface 136 of the base region 130. The protruding region 132 protrudes from the base region 130, through a pair of first pad openings 138 in the buffer layer 126, the isolation region 116, and the ILD layer 104, to the metal line 110. The first pad openings 138 are laterally spaced along a periphery of the base region 130 and extend laterally in parallel (not shown). The first pad openings 138 may have, for example, line-shaped footprints.

A pair of second pad openings 140 is arranged in the base and protruding regions 130, 132 of the pad 128. The second pad openings 140 are defined vertically between the base region upper surface 136 and a surface 142 of the protruding region 132 that is recessed below the upper surface 136. Typically, the recessed surface 142 is substantially even with the BEOL metallization layer upper surface 118. The second pad openings 140 are spaced from surfaces of the first pad openings 138 and extend laterally in parallel (not shown). Further, in some embodiments, the second pad openings 140 are centered on centers of the first pad openings 138. The second pad openings 140 may have, for example, line-shaped footprints.

A dielectric layer 144 is arranged over the pad 128, and fills the scribe line opening 120 and the second pad opening 140. Further, a passivation layer 146 is arranged over the dielectric layer 144, and lines the semiconductor substrate upper surface 122 and an upper surface 148 of the dielectric layer 144. In contrast to conventional pad structures, which have a dielectric layer with an upper surface that is aligned with an upper surface of a passivation layer (due to formation of the dielectric layer after the passivation layer and before a planarization process), the dielectric layer upper surface 148 is substantially even with or below the semiconductor substrate upper surface 122, such that the dielectric layer 144 is confined to the scribe line opening 120. This is because the dielectric layer 144 is formed within the scribe line opening 114 prior to performing a planarization process. Furthermore, the passivation layer 146 is arranged over the dielectric layer 144, since the passivation layer 146 is formed after the planarization process to prevent damage to the passivation layer 146.

In some embodiments, the dielectric layer upper surface 148 is concave or substantially planar. The dielectric layer 144 may be, for example, an oxide, such as silicon dioxide. The passivation layer 146 may be, for example, a single or multilayer dielectric film including one or more layers of: oxide, such as silicon dioxide; nitride, such as silicon nitride; and high κ dielectric (i.e., dielectric with a dielectric constant greater than about 3.9). In some embodiments, the passivation layer 146 includes a nitride layer arranged over a pair of oxide layers, which are stacked on opposing sides of a high κ dielectric layer. In other embodiments, the passivation layer 146 includes a nitride layer arranged over an oxide layer.

A third pad opening 150 is arranged in the passivation layer 146 and the dielectric layer 144, over the pad 128. The third pad opening 150 is defined vertically between an upper surface 152 of the passivation layer 146 and a surface 134 of the pad 128 that is recessed below the upper surface 152. The third pad opening 150 exposes the pad 128, thereby allowing an electrical connection to be formed with the pad 128 through the third pad opening 150.

Figure 2A:
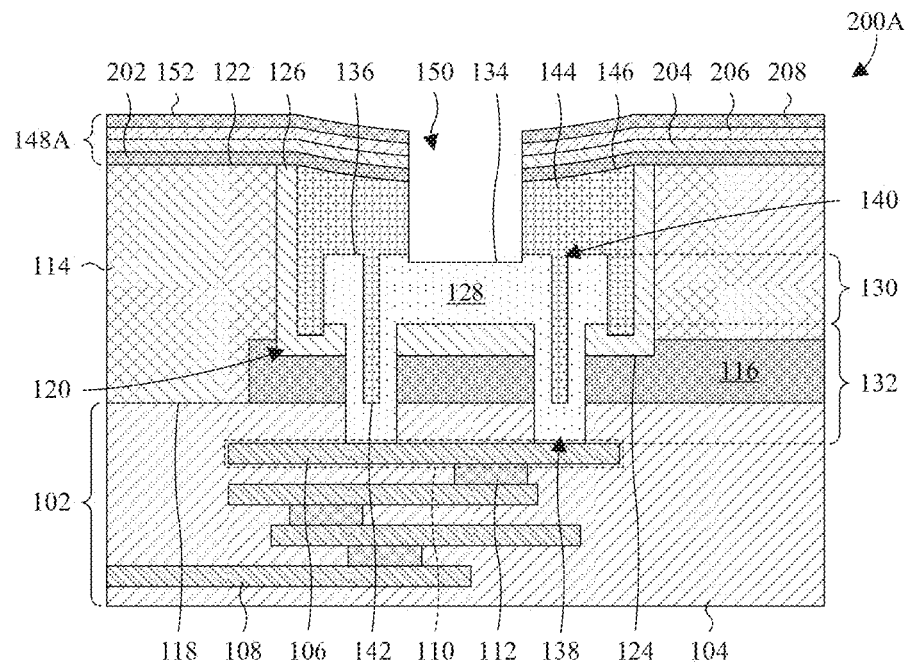
FIG. 2A illustrates a cross-sectional view of some embodiments of an integrated chip having a flat pad structure with a multi-layer passivation layer.

With reference to FIG. 2A, a cross-sectional view 200A of some embodiments of an integrated chip having a flat pad structure with a multi-layer passivation layer 146A is provided. The multi-layer passivation layer 146A includes a first oxide layer 202 arranged over the semiconductor substrate 114 and the dielectric layer 144. Further, the multi-layer passivation layer 146A includes a high κ dielectric layer 204 arranged over the first oxide layer 202, a second oxide layer 206 arranged over the high κ dielectric layer 204, and a nitride layer 208 arranged over the second oxide layer 206. The first and second oxide layers 202, 206 may be, for example, silicon dioxide. The high κ dielectric layer 204 may be, for example, hafnium oxide (HfO), hafnium silicon oxide (HfSiO), hafnium aluminum oxide (HfAlO), or hafnium tantalum oxide (HfTaO). The nitride layer 208 may be, for example, silicon nitride.

Figure 2B:
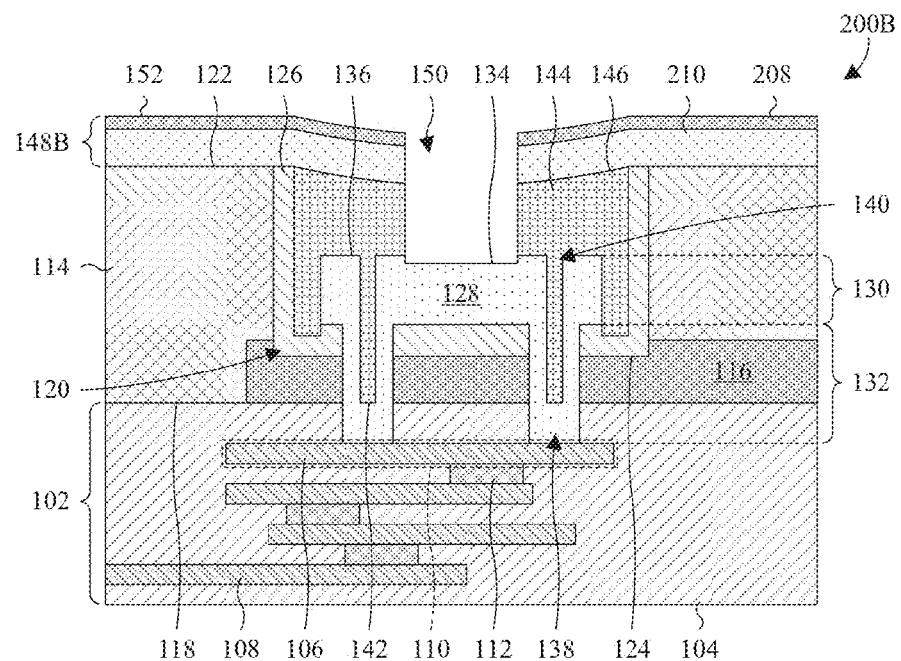
FIG. 2B illustrates a cross-sectional view of alternative embodiments of an integrated chip having a flat pad structure with a multi-layer passivation layer.

With reference to FIG. 2B, a cross-sectional view 200B of some embodiments of an integrated chip having a flat pad structure with an alternative multi-layer passivation layer 146B is provided. The multi-layer passivation layer 146 includes an oxide layer 210 arranged over the semiconductor substrate 114 and the dielectric layer 144. Further, the multi-layer passivation layer 146 includes the nitride layer 208 arranged over the oxide layer 210. The oxide layer 210 may be, for example, silicon dioxide or some other oxide.

Figure 3:
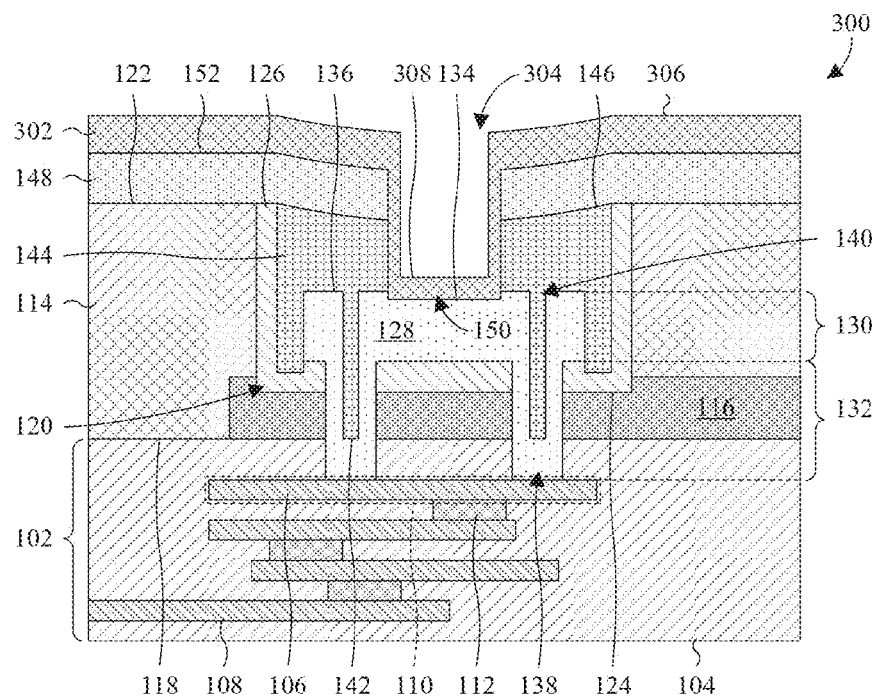
FIG. 3 illustrates a cross-sectional view of some embodiments of an integrated chip having a flat pad structure with a metal connect layer.

With reference to FIG. 3, a cross-sectional view 300 of some embodiments of an integrated chip having a flat pad structure with a metal connect layer 302 is provided. The metal connect layer 302 is arranged over the passivation layer 146 and fills the third pad opening 150. The metal connect layer 302 may be a metal, such as, for example, copper or aluminum copper. Further, the metal connect layer 302 includes a fourth pad opening 304, arranged in the third pad opening 150 and spaced from surfaces of the third pad opening 150. In some embodiments, the fourth pad opening 304 is centered on a center of the third pad opening 150. The fourth pad opening 304 is defined vertically between an upper surface 306 of the metal connect layer 302 and a surface 308 of the metal connect layer 302 that is recessed below the upper surface 306. In some embodiments, the recessed surface 308 of the metal connect layer 302 is recessed below the dielectric layer upper surface 148.

Figure 4:
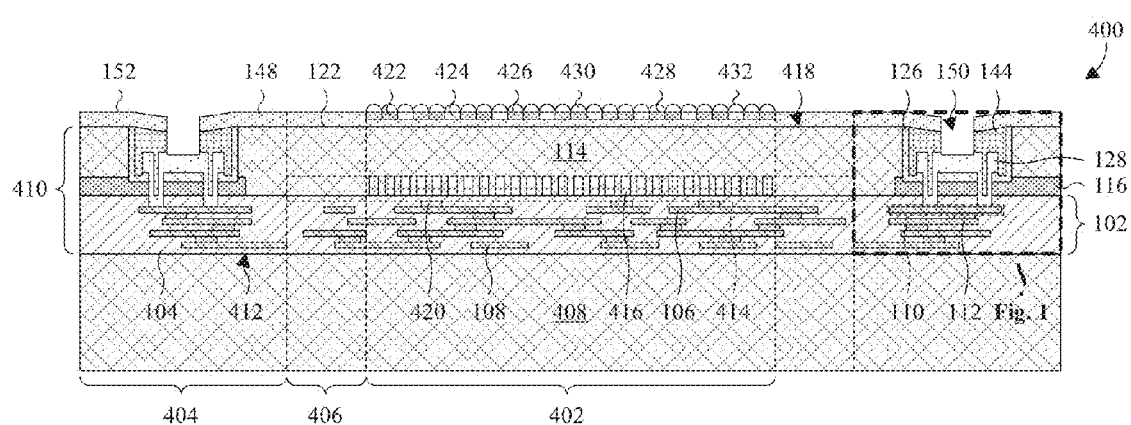
FIG. 4 illustrates a cross-sectional view of some embodiments of a back-side illumination (BSI) complementary metal-oxide-semiconductor (CMOS) image sensor with a flat pad structure.

With reference to FIG. 4, a cross-sectional view 400 of some embodiments of a back-side illuminated (BSI) image sensor within which the flat pad structure finds application is provided. The BSI image sensor includes a sensing region 402, an interconnect region 404, and a logic region 406. The sensing region 402 is arranged at a center of the BSI image sensor, and is configured to sense incident radiation. The interconnect region 404 laterally surrounds the sensing region 402 along an edge of the BSI image sensor, and includes flat pad structures according to FIG. 1 or 3 (illustrated with FIG. 1). The flat pad structures are laterally spaced around the sensing region 402, and are configured to connect the BSI image sensor to external devices. The logic region 406 laterally surrounds the sensing region 402 between the sensing region 402 and the interconnect region 404, and includes logic devices (not shown) configured to support operation of the BSI image sensor.

The sensing, interconnect, and logic regions 402, 404, 406 are arranged within a carrier substrate 408 and an IC 410. The carrier substrate 408 may be, for example, a bulk semiconductor substrate, such as a bulk silicon substrate, or a SOI substrate. The IC 410 is arranged over the carrier substrate 408 and is bonded to the carrier substrate 408 through a front side 412 of the IC 410. The IC 410 includes a device region 414 arranged between a semiconductor substrate 114 and a BEOL metallization stack 102. The device region 414 includes electronic components, such as, for example, one or more of transistors, capacitors, resistors, inductors, photodetectors, and photodiodes. Within the sensing region 402, the device region 414 typically includes an array of pixel sensors 416, such as photodetectors and/or photodiodes. Within the logic region 406, the device region 414 typically includes transistors (not shown).

The semiconductor substrate 114 and the BEOL metallization stack 102 are stacked on opposing sides of the device region 414. The semiconductor substrate 114 is arranged along a back side 418 of the IC 410, opposite the front side 412. The BEOL metallization stack 102 is arranged along the front side 412 of the IC 410, and includes an ILD layer 104 and metallization layers 106, 108 stacked within the ILD layer 104. Contacts 420 electrically couple the device region 414 to the metallization layers 106, 108, and vias 112 electrically couple the metallization layers 106, 108 to one another. The metallization layers 106, 108, the contacts 420, and the vias 112 may be, for example, a conductive material, such as aluminum copper, germanium, copper, or some other metal.

A passivation layer 146 is arranged over the semiconductor substrate 114 along the back side 418 of the IC 410, and lining an upper surface 122 of the semiconductor substrate 114. Further, in some embodiments, a metal connect layer (not shown) is arranged over and lining the passivation layer 146. An array of color filters 422, 424, 426 is buried in the passivation layer 146, within the sensing region 402. Typically, the color filters 422, 424, 426 have planar upper surfaces 428 that are approximately coplanar with an upper surface 152 of the passivation layer 146. The color filters 422, 424, 426 correspond to the pixel sensors 416 and are assigned corresponding colors or wavelengths of radiation (e.g., light). Further, the color filters 422, 424, 426 are configured to transmit the assigned colors or wavelengths of radiation to the corresponding pixel sensors 416. Typically, the color filter assignments alternate between red, green, and blue, such that the color filters 422, 424, 426 include blue color filters 422, red color filters 424, and green color filters 426. In some embodiments, the color filter assignments alternative between red, green, and blue light according to a Bayer mosaic.

An array of micro lenses 430 is arranged over the color filters 422, 424, 426 and the pixel sensors 416. The micro lenses 430 correspond to the pixel sensors 416, and have centers that are typically aligned with centers of the color filters 422, 424, 426 and/or centers of the pixel sensors 416. The micro lenses 430 are configured to focus incident radiation towards the pixel sensors 416 and/or the color filters 422, 424, 426. In some embodiments, the micro lenses 430 have convex upper surfaces 432 configured to focus radiation towards the pixel sensors 416 and/or the color filters 422, 424, 426.

Figure 5:
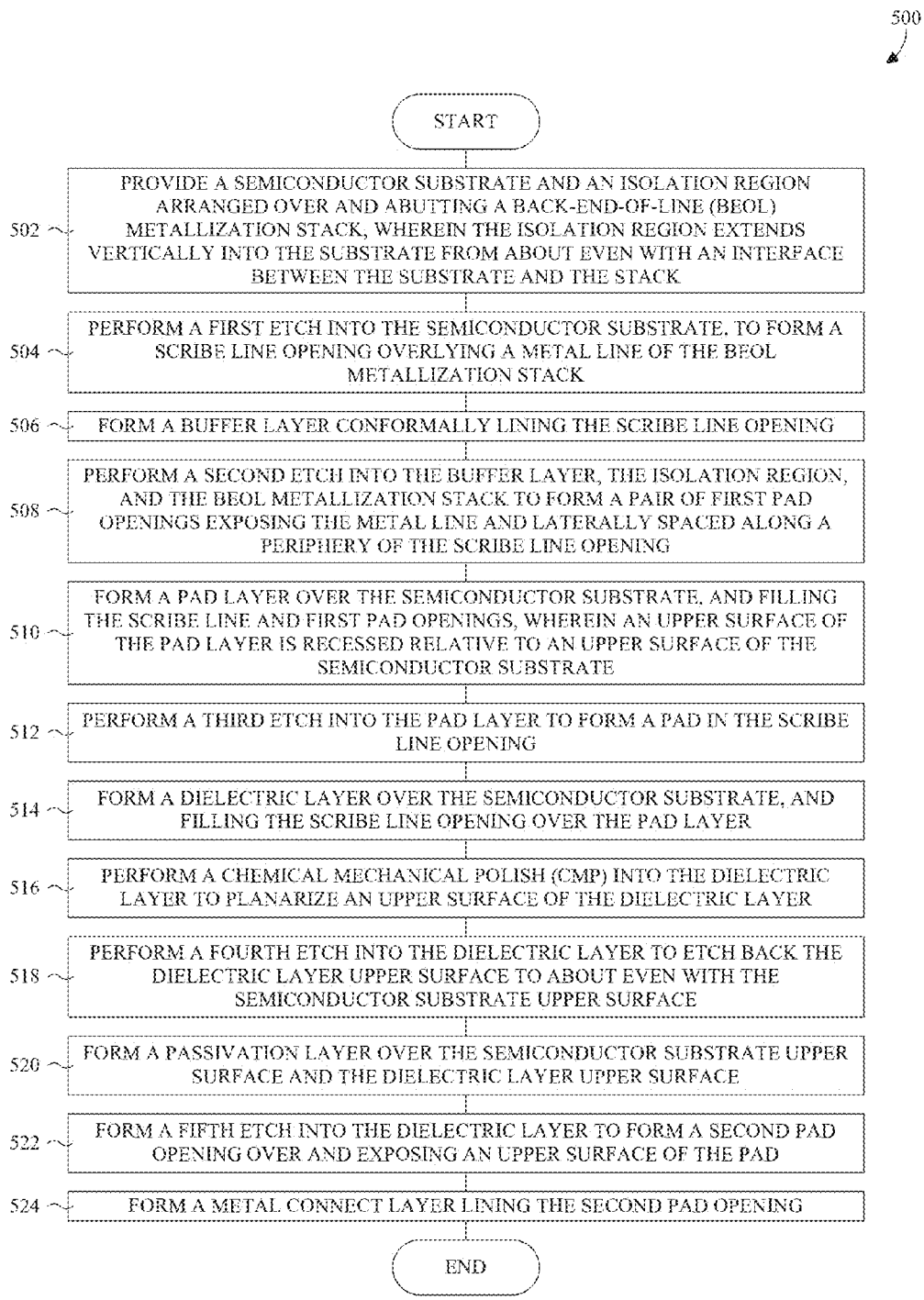
FIG. 5 illustrates a flowchart of some embodiments of a method for manufacturing an integrated chip having a flat pad structure.

With reference to FIG. 5, a flowchart 500 provides some embodiments of a method for manufacturing an integrated chip having a flat pad structure.

At 502, a semiconductor substrate and an isolation region arranged over and abutting a BEOL metallization stack are provided. The isolation region extends vertically into the semiconductor substrate from about even with an interface between the substrate and the BEOL metallization stack.

At 504, a first etch is performed into the semiconductor substrate, to form a scribe line opening overlying a metal line of the BEOL metallization stack.

At 506, a buffer layer is formed conformally lining the scribe line opening.

At 508, a second etch is performed into the buffer layer, the isolation region, and the BEOL metallization stack to form a pair of first pad openings exposing the metal line and laterally spaced along a periphery of the scribe line opening.

At 510, a pad layer is formed over the semiconductor substrate, and filling the scribe line and first pad openings. An upper surface of the pad layer is recessed relative to an upper surface of the semiconductor substrate.

At 512, a third etch is performed into the pad layer to form a pad in the scribe line opening. In some embodiments, the third etch forms one or more additional pads laterally spaced from one another and the pad in the scribe line opening.

At 514, a dielectric layer is formed over the semiconductor substrate, and filling the scribe line opening over the pad layer.

At 516, a CMP is performed into the dielectric layer to planarize an upper surface of the dielectric layer.

At 518, a fourth etch is performed into the dielectric layer to etch back the dielectric layer upper surface to about even with the semiconductor substrate upper surface. Advantageously, during the fourth etch, the semiconductor substrate may be used as an etch stop layer. This, in turn, may improve within wafer uniformity during bulk manufacture. Further, at least where the dielectric layer is oxide and the semiconductor substrate is silicon, the risk of damage to the semiconductor substrate may minimal or nonexistent since etchants with a high selectivity (e.g., a selectivity of about 100) for oxide, relative to silicon, are known. The fourth etch results in a substantially planar surface upon, which may be advantageous for subsequently formed CMOS image sensor structures, such as a BCFA.

At 520, a passivation layer is formed over the semiconductor substrate upper surface and the dielectric layer upper surface. Advantageously, by forming the passivation layer after forming the fourth etch, passivation layer damage (e.g., due to the CMP) is eliminated. The passivation layer cannot be damaged from the pad and dielectric layer formation since it is not formed until after the pad and dielectric layer formation. In some embodiments, a BCFA is hereafter formed in the passivation layer.

At 522, a fifth etch is performed into the dielectric layer to form a second pad opening over and exposing an upper surface of the pad.

At 524, in some embodiments, a metal connect layer is formed lining the second pad opening.

While the disclosed method (e.g., the method described by the flowchart 500) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6-18, cross-sectional views of some embodiments of an integrated chip having a flat pad structure at various stages of manufacture are provided to illustrate the method of FIG. 6-18. Although FIGS. 6-18 are described in relation to the method, it will be appreciated that the structures disclosed in FIGS. 6-18 are not limited to the method, but instead may stand alone as structures independent of the method. Similarly, although the method is described in relation to FIGS. 6-18, it will be appreciated that the method is not limited to the structures disclosed in FIGS. 6-18, but instead may stand alone independent of the structures disclosed in FIGS. 6-18.

Figure 6:
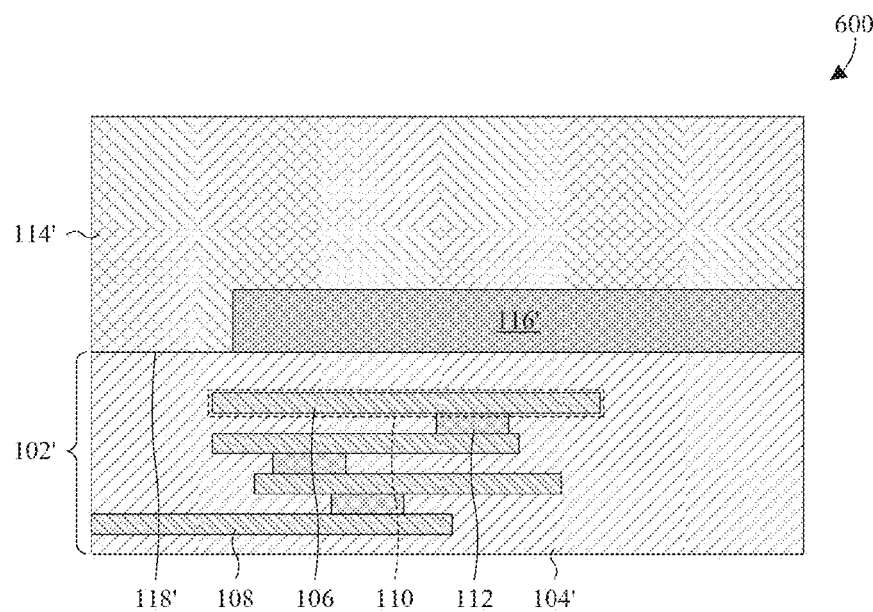
FIGS. 6-18 illustrate a series of cross-sectional views of some embodiments of an integrated chip having a flat pad structure at various stages of manufacture according to the method of FIG. 5.

FIG. 6 illustrates a cross-sectional view 600 of some embodiments corresponding to Act 502. As illustrated, a semiconductor substrate 114' and an isolation region 116' arranged over and abutting a BEOL metallization stack 102' are provided. The semiconductor substrate 114' and the isolation region 116' both abut an upper surface 118' of the BEOL metallization stack 102', laterally adjacent to one another, and the isolation region 116' extends vertically from the upper surface 118' into the semiconductor substrate 114'. The semiconductor substrate 114' may be, for example, a bulk silicon substrate. The isolation region 116' may be, for example, an STI region. The BEOL metallization stack 102' includes an ILD layer 104' and metallization layers 106, 108 stacked within the ILD layer 104'. The metallization layers 106, 108 include an upper metallization layer 106 with a metal line 110, and are electrically coupled to one another by vias 112. The ILD layer 104' may be, for example, a low κ dielectric or an oxide. The metallization layers 106, 108, the vias 112, and the metal line 110 may be, for example, a metal.

Figure 7:
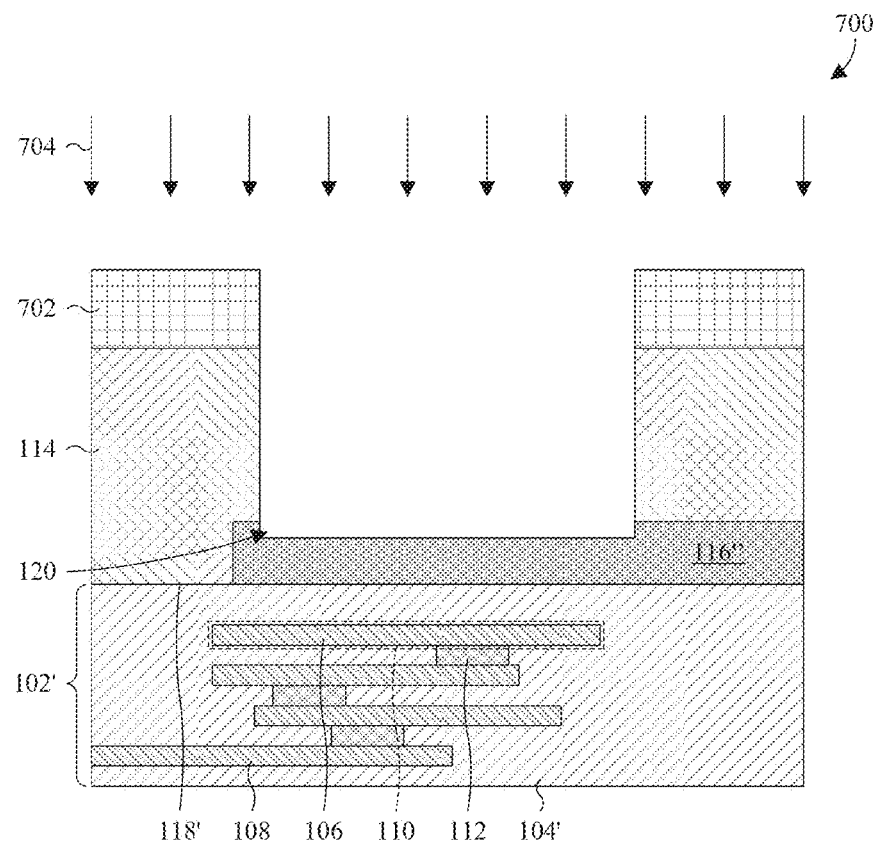

FIG. 7 illustrates a cross-sectional view 700 of some embodiments corresponding to Act 504. As illustrated, a first etch is performed into the semiconductor substrate 114' (see FIG. 6), through a select region overlying the metal line 110, to the isolation region 116' (see FIG. 6). In some embodiments, due to over etching, the isolation region 116' may be eroded under the select region. The first etch results in a scribe line opening 120 overlying the metal line 110 and arranged in a remaining semiconductor substrate 114 and, in some embodiments, a remaining isolation region 116". Although not shown, the scribe line opening 120 typically extends laterally around an array of pixel sensors (e.g., see FIG. 4). The process for performing the first etch may include forming a first photoresist layer 702 masking regions of the semiconductor substrate 114' laterally surrounding the select region. Further, a first etchant 704 may be applied to the semiconductor substrate 114' according to a pattern of the first photoresist layer 702. Thereafter, the first photoresist layer 702 may be removed.

Figure 8:
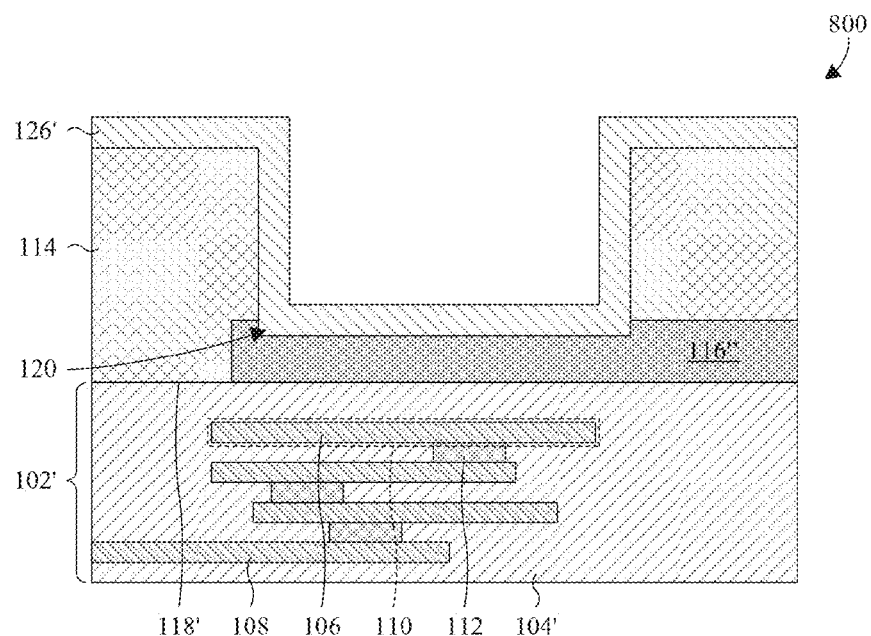

FIG. 8 illustrates a cross-sectional view 800 of some embodiments corresponding to Act 506. As illustrated, a buffer layer 126' is formed over the semiconductor substrate 114 and lining the scribe line opening 120. The buffer layer 126' may be formed using vapor deposition (e.g., chemical vapor deposition (CVD)), thermal oxidation, spin coating, or any other suitable deposition technique. However, the buffer layer 126' is typically formed conformally. Further, the buffer layer 126' may be formed as, for example, an oxide, such as silicon dioxide.

Figure 9:
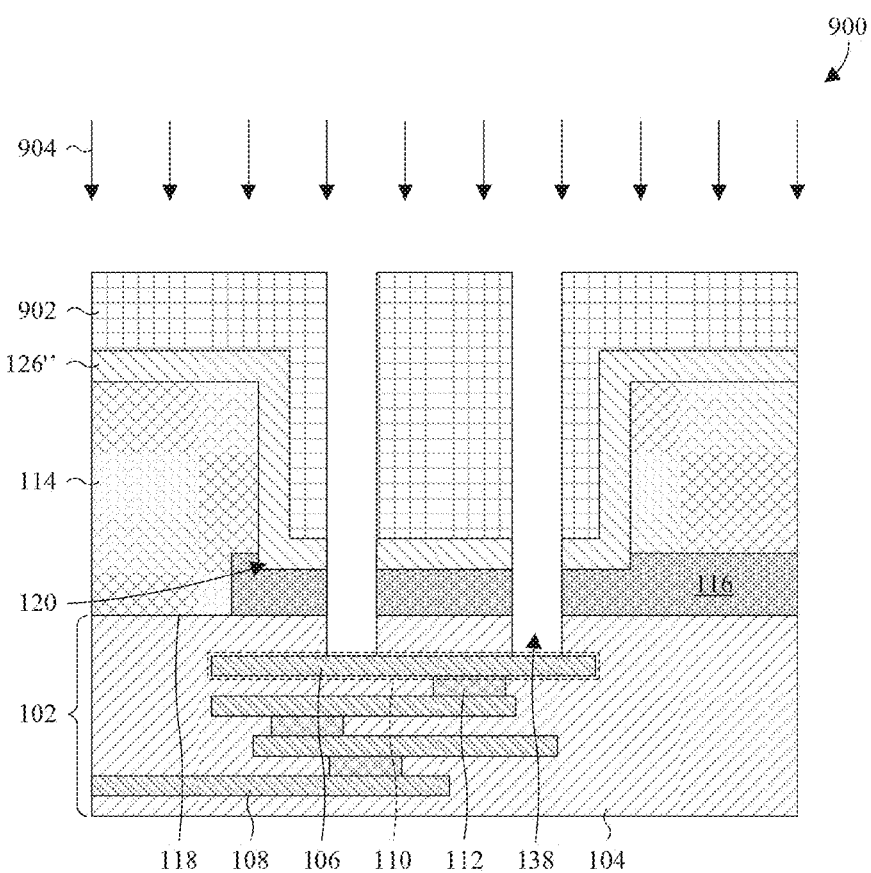

FIG. 9 illustrates a cross-sectional view 900 of some embodiments corresponding to Act 508. As illustrated, a second etch is performed into the buffer layer 126' (see FIG. 8), the isolation region 116" (see FIG. 8), and the ILD layer 104' (see FIG. 8), through select regions, to the metal line 110. The select regions are laterally spaced and extend laterally in parallel along the periphery of the scribe line opening 120. The second etch results in a pair of first pad openings 138 overlying the metal line 110. The first pad openings 138 extend through a remaining buffer layer 126", a remaining isolation region 116, and an upper surface 118 of a remaining ILD layer 104, into the remaining ILD layer 104. Further, the first pad openings 138 typically have line-shaped footprints. The process for performing the second etch may include forming a second photoresist layer 902 masking regions of the buffer layer 126' laterally surrounding the select regions. Further, one or more second etchants 904 may be applied to the buffer layer 126', the isolation region 116", and the ILD layer 104' according to a pattern of the second photoresist layer 902. Thereafter, the second photoresist layer 902 may be removed.

Figure 10:
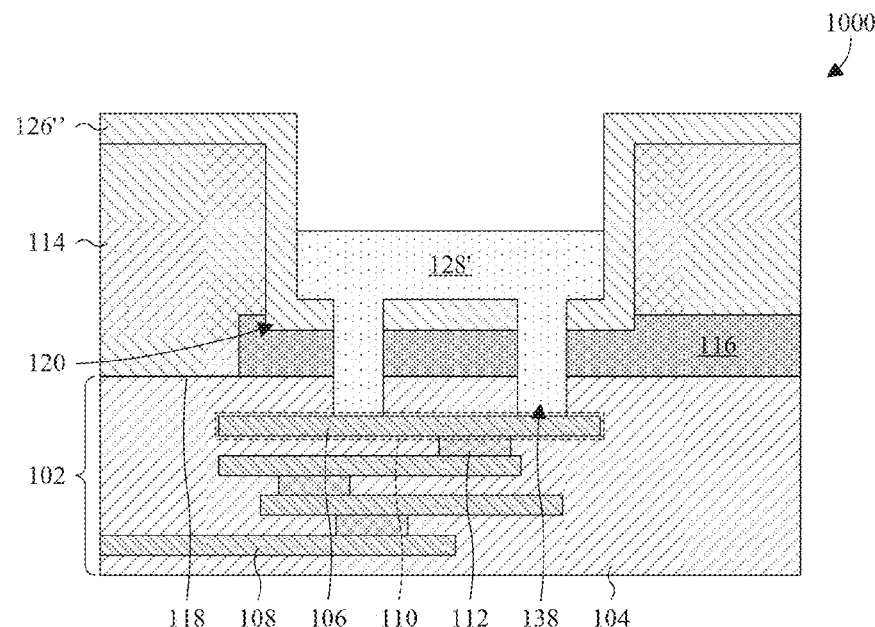

FIG. 10 illustrates a cross-sectional view 1000 of some embodiments corresponding to Act 510. As illustrated, a pad layer 128' is formed over the buffer layer 126", fully filling the first pad openings 138 and partially filling the scribe line opening 120. The pad layer 128' may be formed as, for example, a metal, such as aluminum copper, copper, aluminum, or some other metal. In some embodiments, the process for forming the pad layer 128' may include forming a seed layer lining the first pad openings 138 and a lower portion of the scribe line opening 120. The seed layer may be formed lining the lower portion of the scribe line opening 120 by conformally forming the seed layer and subsequently etching back the seed layer. Thereafter, the pad layer 128' may be grown from the seed layer using a plating process (e.g., an electro-plating process or an electro-less plating process). In other embodiments, the process for forming the pad layer 128' may include forming an intermediate layer filling the scribe line opening 120 and the first pad openings 138. Thereafter, a CMP and etch back may be performed into the intermediate layer to form the pad layer 128'.

Figure 11:
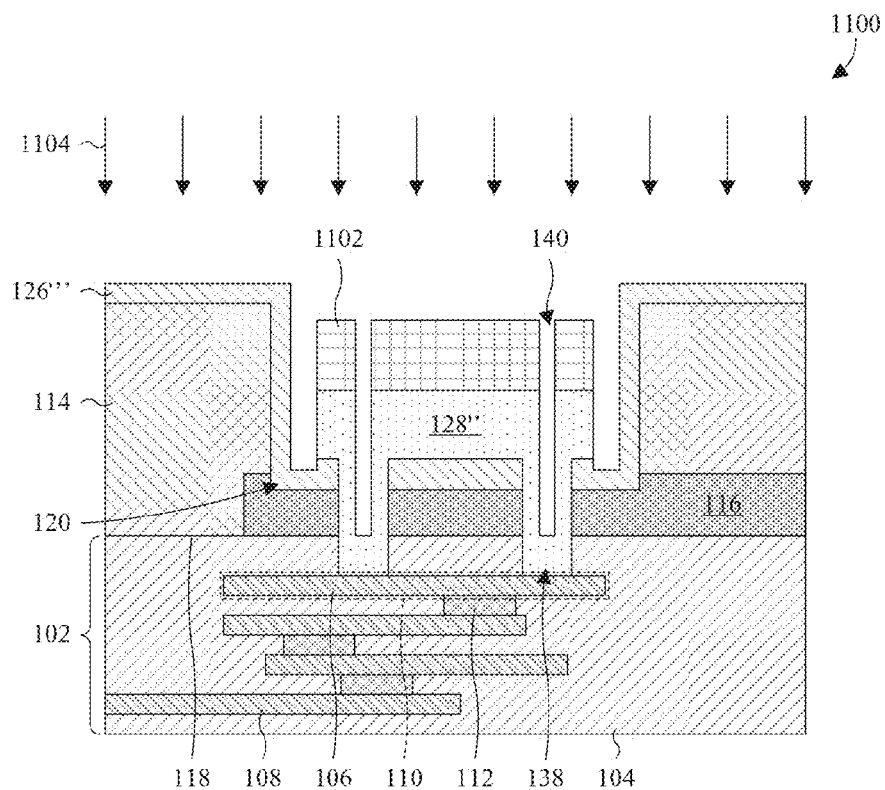

FIG. 11 illustrates a cross-sectional view 1100 of some embodiments corresponding to Act 512. As illustrated, a third etch is performed into the pad layer 128' (see FIG. 10), through select regions overlying the first pad openings 138 and through select regions extending laterally around a pad region of the pad layer 128'. In some embodiments, due to over etching and/or lateral etching, the buffer layer 126" (see FIG. 10) may be eroded. The third etch results in a pad 128" having a substantially planar upper surface 136', and having sidewall surfaces laterally spaced from neighboring sidewall surfaces of a remaining buffer layer 126''' and/or neighboring sidewalls surfaces of other pads. Further, the pad 128" has a pair of second pad openings 140 extending vertically into the first pad openings 138 and spaced from surfaces of the first pad openings 138. The process for performing the third etch may include forming a third photoresist layer 1102 masking regions of the pad layer 128' laterally surrounding the select regions. Further, a third etchant 1104 may be applied to the pad layer 128' according to a pattern of the third photoresist layer 1102. Thereafter, the third photoresist layer 1102 may be removed.

Figure 12:
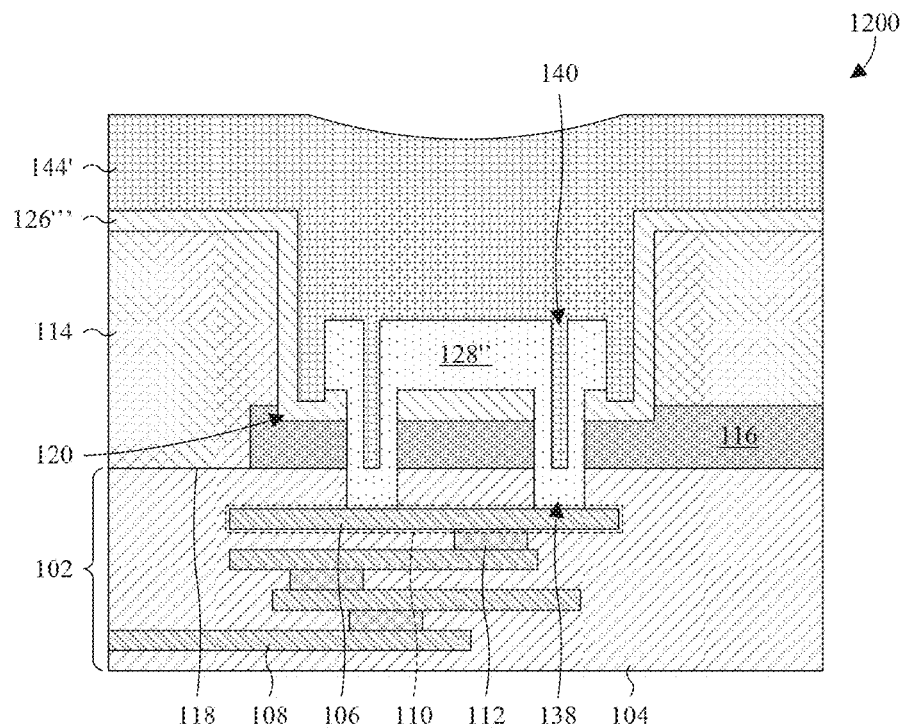

FIG. 12 illustrates a cross-sectional view 1200 of some embodiments corresponding to Act 514. As illustrated, a dielectric layer 144' is formed over the buffer layer 126''', and filling the scribe line opening 120 and the second pad openings 140. The dielectric layer 144' may be formed using vapor deposition, thermal oxidation, spin coating, or any other suitable deposition technique. Further, the dielectric layer 144' may be formed as, for example, an oxide, such as silicon dioxide, or some other dielectric.

Figure 13:
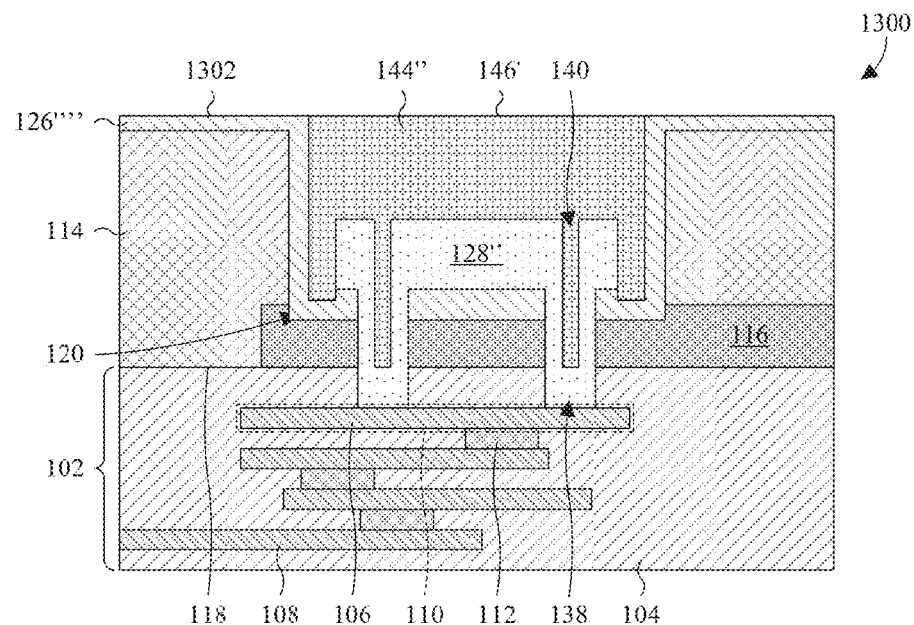

FIG. 13 illustrates a cross-sectional view 1300 of some embodiments corresponding to Act 516. As illustrated, a CMP is performed into the dielectric layer 144' (see FIG. 12) and, in some embodiments, into the buffer layer 126''' (see FIG. 12). The CMP results in a remaining dielectric layer 144" with a planar upper surface 148', which is, in some embodiments, substantially even with an upper surface 1302 of a remaining buffer layer 126"".

Figure 14:
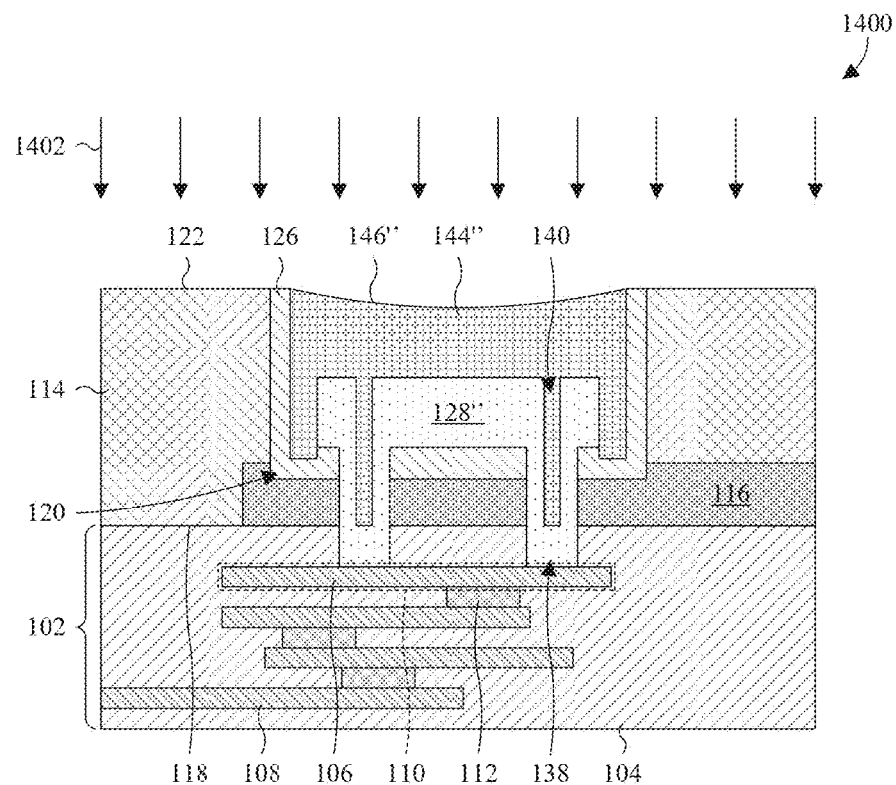

FIG. 14 illustrates a cross-sectional view 1400 of some embodiments corresponding to Act 518. As illustrated, a fourth etch is performed into the dielectric layer 144' (see FIG. 13) and the buffer layer 126"" (see FIG. 13) to etch back the upper surfaces 148', 1302 (see FIG. 13) of the dielectric and buffer layers 126"", 144' to below or about even with an upper surface 122 of the semiconductor substrate 114. The fourth etch results in a remaining dielectric layer 144" laterally surrounded by a remaining buffer layer 126 and having a substantially planar or concave upper surface 148". The process for performing the fourth etch may include applying a fourth etchant 1402 to the dielectric layer 144' and the buffer layer 126"". In some embodiments, the fourth etchant 1402 may be more selective of a material of the dielectric layer 144' than of a material of the semiconductor substrate 114 (e.g., more selective of oxide than silicon).

Figure 15:
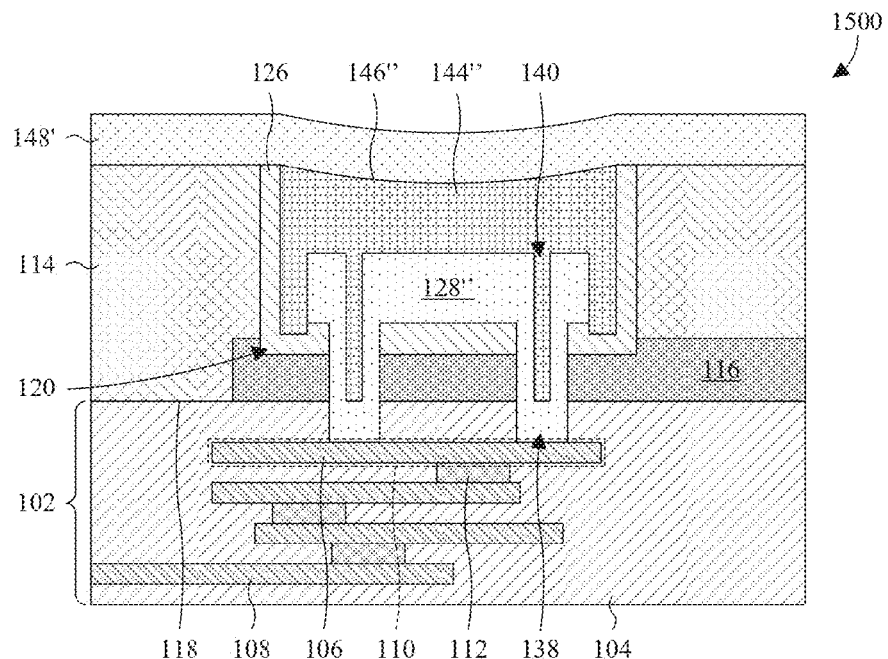

FIG. 15 illustrates a cross-sectional view 1500 of some embodiments corresponding to Act 520. As illustrated, a passivation layer 146' is formed over the semiconductor substrate 114 and the dielectric layer 144". The passivation layer 146' may be formed as, for example, a single or multilayer dielectric film including one or more layers of oxide, nitride, and high κ dielectric. The one or more layers may be formed by sequentially depositing the layers using vapor deposition, thermal oxidation, spin coating, or any other suitable deposition technique.

Figure 16:
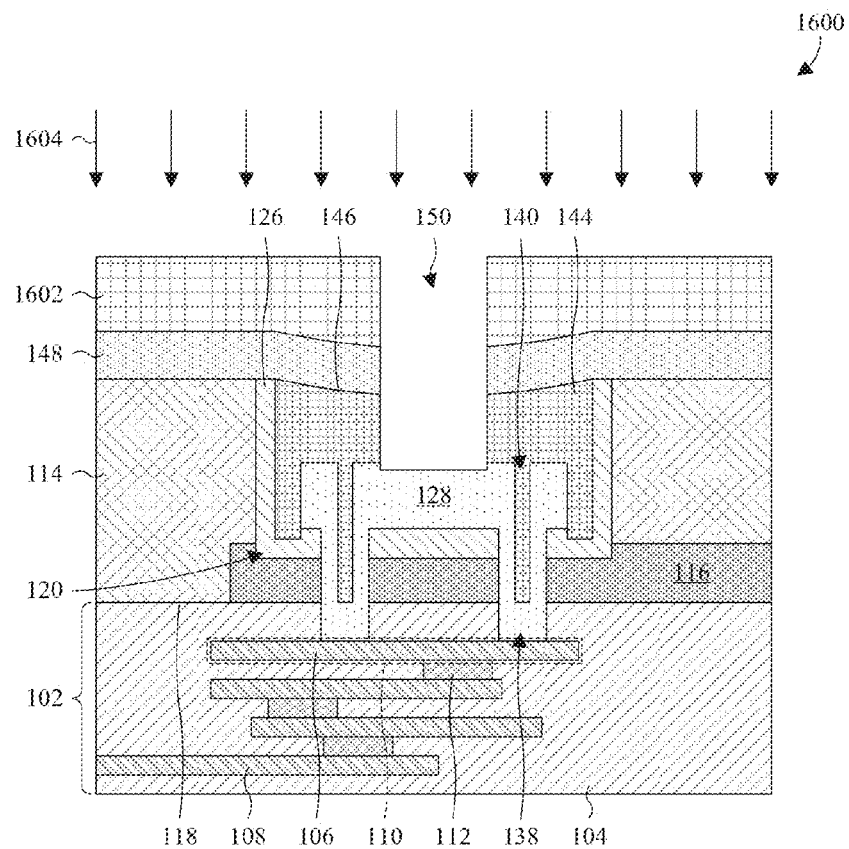

FIG. 16 illustrates a cross-sectional view 1600 of some embodiments corresponding to Act 522. As illustrated, a fifth etch is performed into the passivation layer 146' (see FIG. 15) and the dielectric layer 144" (see FIG. 15), through select regions overlying the pad 128" (see FIG. 15). In some embodiments, due to over etching, the pad 128" may be eroded under the select regions. The fifth etch results in a third pad opening 150 overlying and exposing a remaining pad 128. The process for performing the fifth etch may include forming a fourth photoresist layer 1602 masking regions of the passivation layer 146' and the dielectric layer 144" laterally surrounding the select regions. Further, a fifth etchant 1604 may be applied to the passivation layer 146' according to a pattern of the fourth photoresist layer 1602. Thereafter, the fourth photoresist layer 1602 may be removed.

Figure 17:
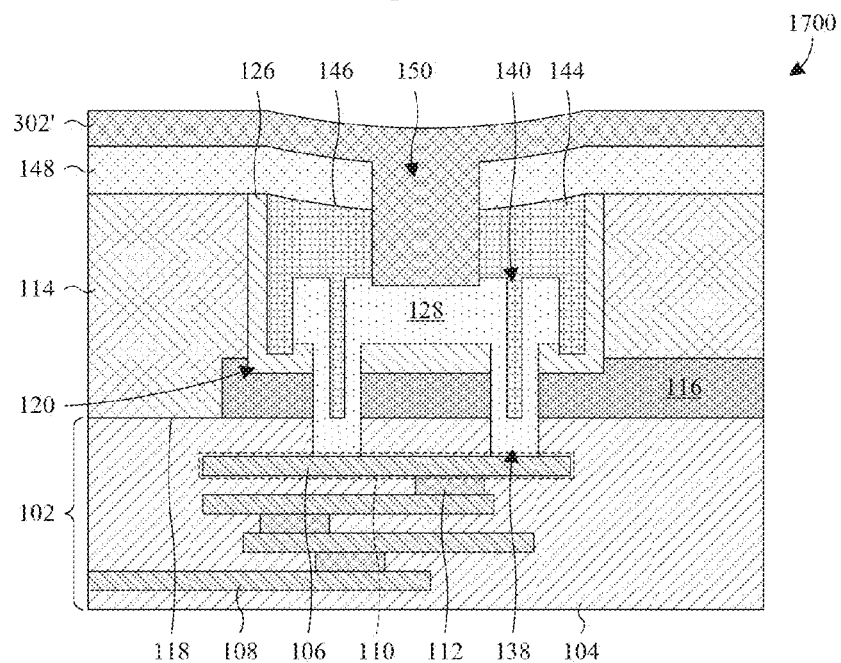
Figure 18:
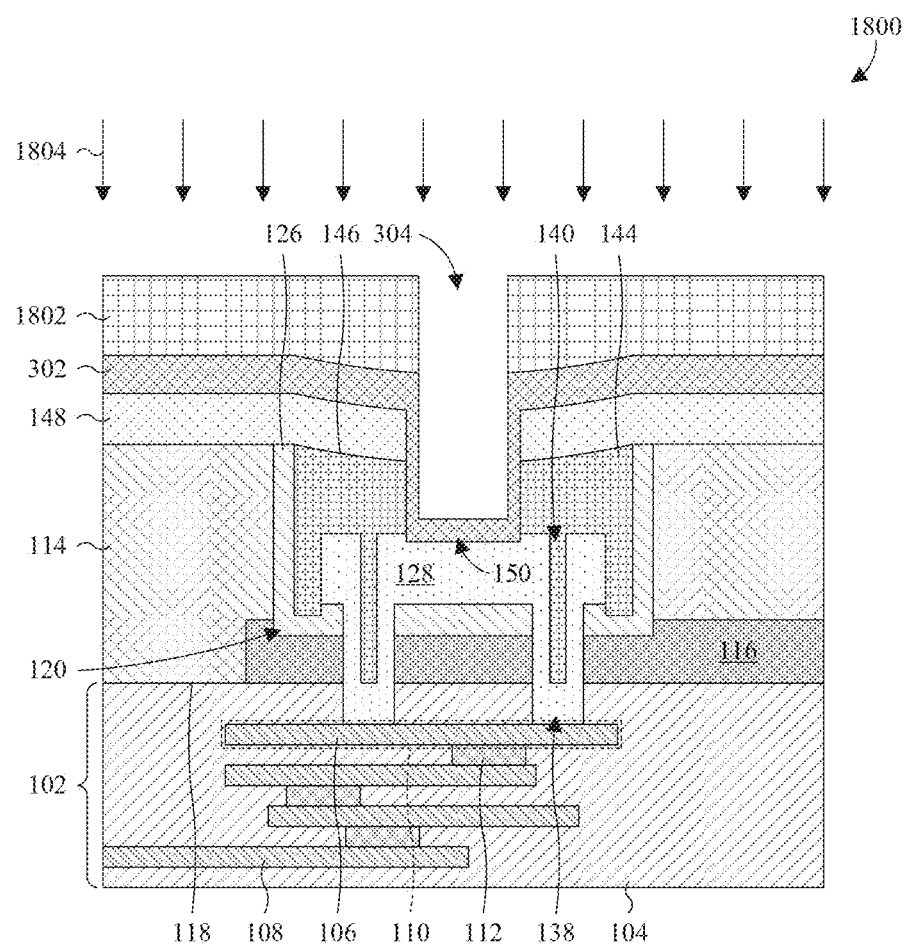

FIGS. 17 and 18 illustrate cross-sectional views 1700, 1800 of some embodiments corresponding to Act 524.

As illustrated by FIG. 17, a metal connect layer 302' is formed over the passivation layer 146 and filling the third pad opening 150. The metal connect layer 302' may be formed as, for example, a metal, such as copper or aluminum copper. Further, the metal connect layer 302' may be formed using, for example, vapor deposition, thermal oxidation, spin coating, or any other suitable deposition technique.

As illustrated by FIG. 18, a sixth etch is performed into the metal connect layer 302' (see FIG. 17), through a select region within the third pad opening 150. The sixth etch results in a remaining metal connect layer 302 with a fourth pad opening 304 centered on a center of the third pad opening 150 and vertically spaced from the pad 128. The process for performing the sixth etch may include forming a fifth photoresist layer 1802 masking regions of the metal connect layer 302' laterally surrounding the select region. Further, a sixth etchant 1804 may be applied to the metal connect layer 302' according to a pattern of the fifth photoresist layer 1802. Thereafter, the fifth photoresist layer 1802 may be removed.

Thus, as can be appreciated from above, the present disclosure provides a pad structure of an image sensor. A semiconductor substrate is arranged over a BEOL metallization stack, and comprises a scribe line opening. A buffer layer lines the scribe line opening. A conductive pad comprises a base region and a protruding region. The base region is arranged over the buffer layer in the scribe line opening, and the protruding region protrudes from the base region into the BEOL metallization stack. A dielectric layer fills the scribe line opening over the conductive pad, and is substantially flush with an upper surface of the semiconductor substrate.

In other embodiments, the present disclosure provides a method for manufacturing a pad structure of an image sensor is provided. A first etch is performed into a semiconductor substrate arranged over a BEOL metallization stack to form a scribe line opening. A conductive pad is formed within the scribe line opening, and electrically contacts the BEOL metallization stack. A dielectric layer is formed within the scribe line opening over the conductive pad. The dielectric layer has an upper surface that is substantially flush with an upper surface of the semiconductor substrate. A passivation layer is formed over the conductive pad, the dielectric layer, and the semiconductor substrate.

In yet other embodiments, the present disclosure provides an image sensor. A BEOL metallization stack is arranged over a carrier substrate. A semiconductor substrate is arranged over the BEOL metallization stack, and comprises an array of pixel sensors and a scribe line opening. The scribe line opening laterally surrounds the pixel sensor array along a periphery of the semiconductor substrate. A buffer layer lines the scribe line opening. A conductive pad comprises a base region and a protruding region. The base region is arranged over the buffer layer in the scribe line opening, and the protruding region protrudes from the base region to a corresponding metal line of the BEOL metallization stack. A dielectric layer fills the scribe line opening over the conductive pad, and is substantially flush with the semiconductor substrate. A passivation layer is arranged over the semiconductor substrate and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pad structure of an image sensor, the pad structure comprising:
    a semiconductor substrate arranged over a back end of line (BEOL) metallization stack, and comprising a peripheral opening;
    a buffer layer lining the peripheral opening;
    a conductive pad comprising a base region and a protruding region, the base region arranged over the buffer layer in the peripheral opening, and the protruding region protruding from the base region into the BEOL metallization stack; and
    a dielectric layer filling the peripheral opening over the conductive pad, and having a top surface that is substantially flush with an upper surface of the semiconductor substrate, wherein the dielectric layer laterally spaces sidewalls of the base region from sidewalls of the buffer layer and from sidewalls of the peripheral opening.

2. The pad structure according to claim 1, further including:
    a carrier substrate underlying the BEOL metallization stack, wherein the carrier substrate is devoid of electronic devices arranged therein; and
    an array of pixel sensors arranged in the semiconductor substrate laterally adjacent to the conductive pad.

3. The pad structure according to claim 1, further comprising:
    an isolation region arranged over the BEOL metallization stack and extending into the semiconductor substrate, wherein the protruding region extends through the isolation region to the BEOL metallization stack.

4. The pad structure according to claim 1, wherein the conductive pad further comprises a pair of line-shaped openings that are laterally spaced and that extend laterally in parallel along a periphery of the base region.

5. The pad structure according to claim 1, further comprising:
    a passivation layer arranged over the semiconductor substrate and the dielectric layer.

6. The pad structure according to claim 5, wherein the dielectric and passivation layers comprise a pad opening exposing the conductive pad.

7. The pad structure according to claim 6, further comprising:
    a metal connect layer arranged over the passivation layer and lining the pad opening.

8. The pad structure according to claim 1, wherein the conductive pad further comprises a pair of openings that are laterally spaced and that extend vertically through the base region to respective locations within the protruding region.

9. The pad structure according to claim 1, wherein the top surface of the dielectric layer begins and ends respectively at opposite sidewalls of the peripheral opening.

10. An image sensor comprising:
    a back end of line (BEOL) metallization stack arranged over a carrier substrate;
    a semiconductor substrate arranged over the BEOL metallization stack, and comprising an array of pixel sensors and a peripheral opening, wherein the peripheral opening laterally surrounds the pixel sensor array along a periphery of the semiconductor substrate;
    a buffer layer lining the peripheral opening;
    a conductive pad comprising a base region and a protruding region, the base region arranged over the buffer layer in the peripheral opening, and the protruding region protruding from the base region to a corresponding metal line of the BEOL metallization stack, wherein the buffer layer has a bottom surface spaced below a bottom surface of the base region by a thickness of the buffer layer;
    a dielectric layer filling the peripheral opening over the conductive pad, and being substantially flush with the semiconductor substrate; and
    a passivation layer arranged over the semiconductor substrate and the dielectric layer.

11. The image sensor according to claim 10, wherein the dielectric layer is oxide and the semiconductor substrate is silicon.

12. The image sensor according to claim 10, wherein the dielectric and passivation layers comprise a pad opening exposing the conductive pad.

13. The image sensor according to claim 12, wherein the conductive pad further comprises a pair of line-shaped openings that are laterally spaced and that extend laterally in parallel along a periphery of the base region, and wherein the pad opening is laterally spaced between the line-shaped openings.

14. The image sensor according to claim 10, wherein a top surface of the base region is recessed below a top surface of the semiconductor substrate, and wherein the buffer layer and the dielectric layer are restricted to the peripheral opening.

15. The image sensor according to claim 10, wherein the semiconductor substrate is devoid of openings laterally from the peripheral opening to an outer sidewall of the semiconductor substrate.

16. The image sensor according to claim 10, wherein a bottom surface of the passivation layer contacts top surfaces respectively of the semiconductor substrate, the buffer layer, and the dielectric layer.

17. An image sensor comprising:
  a semiconductor substrate overlying a back end of line (BEOL) metallization stack, wherein the semiconductor substrate comprises an array of pixel sensors and a peripheral opening laterally adjacent to the array of pixels sensors;
  a conductive pad comprising a base region and a protruding region, wherein the base region is arranged in the peripheral opening and the protruding region protrudes from the base region to a metal line in the BEOL metallization stack, wherein the protruding region comprises a pair of segments that are laterally spaced and that protrude to and contact a same metal line of the BEOL metallization stack, wherein the same metal line is continuous from one of the segments to another one of the segments;
  a dielectric layer filling the peripheral opening over the conductive pad; and
  a passivation layer arranged over the semiconductor substrate and the dielectric layer, wherein the dielectric and passivation layers comprise a pad opening exposing the base region of the conductive pad.

18. The image sensor according to claim 17, wherein the conductive pad comprises a pair of line-shaped openings that are laterally spaced and that extend laterally in parallel along a periphery of the base region, and wherein the pad opening is laterally spaced between the line-shaped openings.

19. The image sensor according to claim 17, further comprising:
  a buffer layer lining the peripheral opening and having a bottom surface spaced below a bottom surface of the base region by a thickness of the buffer layer, wherein the base region is arranged over the buffer layer and the protruding region protrudes through the buffer layer.

20. The image sensor according to claim 17, wherein the same metal line is arranged in a metallization layer closest to the semiconductor substrate.

* * * * *